(12) United States Patent
Taylor et al.

(10) Patent No.: US 6,263,398 B1
(45) Date of Patent: Jul. 17, 2001

(54) INTEGRATED CIRCUIT MEMORY DEVICE INCORPORATING A NON-VOLATILE MEMORY ARRAY AND A RELATIVELY FASTER ACCESS TIME MEMORY CACHE

(75) Inventors: Craig Taylor, Colorado Springs; Donald G. Carrigan, Monument; Mike Alwais, Colorado Springs, all of CO (US)

(73) Assignee: Ramtron International Corporation, Colorado Springs, CO (US)

( * ) Notice: Subject to any disclaimer, the term of this patent is extended or adjusted under 35 U.S.C. 154(b) by 0 days.

(21) Appl. No.: 09/021,132

(22) Filed: Feb. 10, 1998

(51) Int. Cl.$^7$ ................................................. G06F 12/00
(52) U.S. Cl. ............................. 711/3; 711/101; 711/102; 711/103
(58) Field of Search ............................. 711/103, 104, 711/142, 143, 144, 145, 3, 102, 101

(56) References Cited

U.S. PATENT DOCUMENTS

| | | | |
|---|---|---|---|
| 4,809,225 | 2/1989 | Dimmler et al. | 365/149 |
| 5,307,470 | * 4/1994 | Kataoka et al. | 711/103 |
| 5,682,344 | 10/1997 | Seyyedy | 365/145 |
| 5,699,317 | * 12/1997 | Sartore et al. | 365/230.06 |
| 5,721,862 | * 2/1998 | Sartore et al. | 365/189.04 |
| 5,737,748 | * 4/1998 | Shigeeda | 711/122 |
| 5,802,583 | * 9/1998 | Yeager et al. | 711/152 |
| 5,860,113 | * 1/1999 | Tung | 711/144 |
| 6,012,140 | * 1/2000 | Thomason | 712/226 |

* cited by examiner

Primary Examiner—Tuan V. Thai
Assistant Examiner—Matthew D. Anderson
(74) Attorney, Agent, or Firm—William J. Kubida, Esq.; Hogan & Hartson, LLP

(57) ABSTRACT

An integrated circuit memory device incorporating a non-volatile memory array and a relatively faster access time memory cache integrated monolithically therewith improves the overall access time in page and provides faster cycle time for read operations. In a particular embodiment, the cache may be provided as static random access memory ("SRAM") and the non-volatile memory array provided as ferroelectric random access memory wherein on a read, the row is cached and the write back cycle is started allowing subsequent in page reads to occur very quickly. If in page accesses are sufficient the memory array precharge may be hidden and writes can occur utilizing write back or write through caching. In alternative embodiments, the non-volatile memory array may comprise electrically erasable read only memory ("EEPROM") or Flash memory in conjunction with an SRAM cache or a ferroelectric random access memory based cache which has symmetric read/write times and faster write times than either EEPROM or Flash memory.

20 Claims, 13 Drawing Sheets

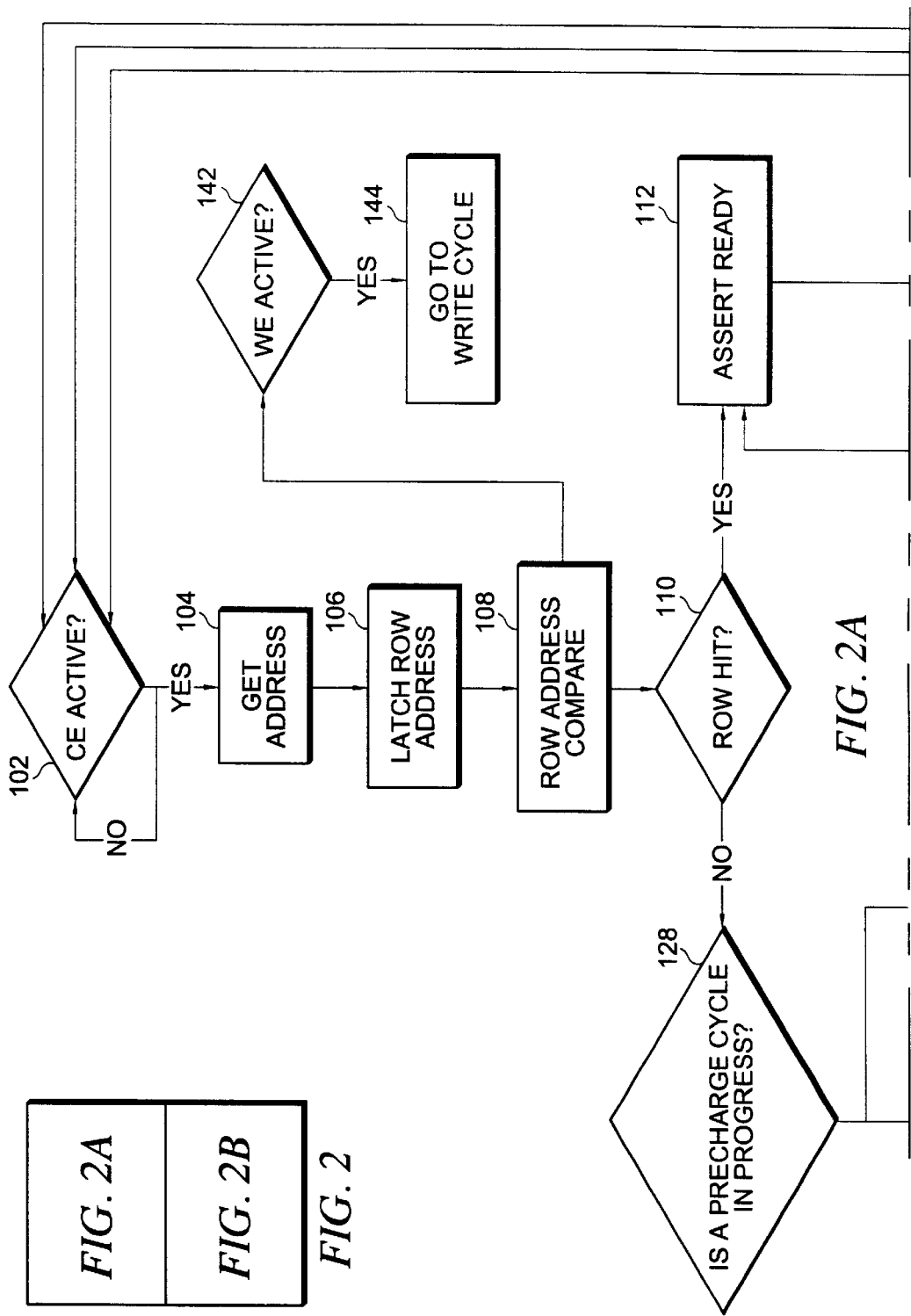

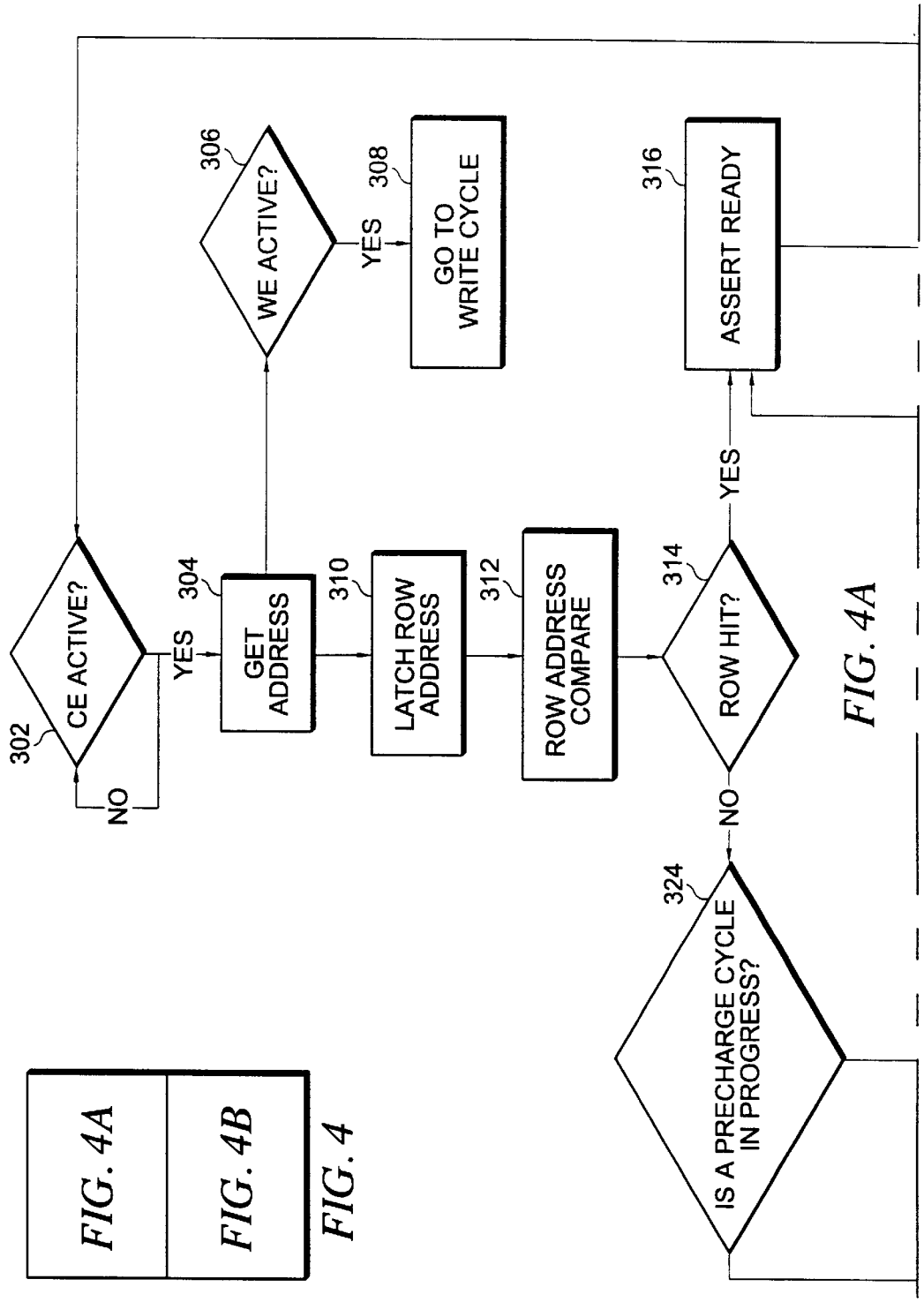

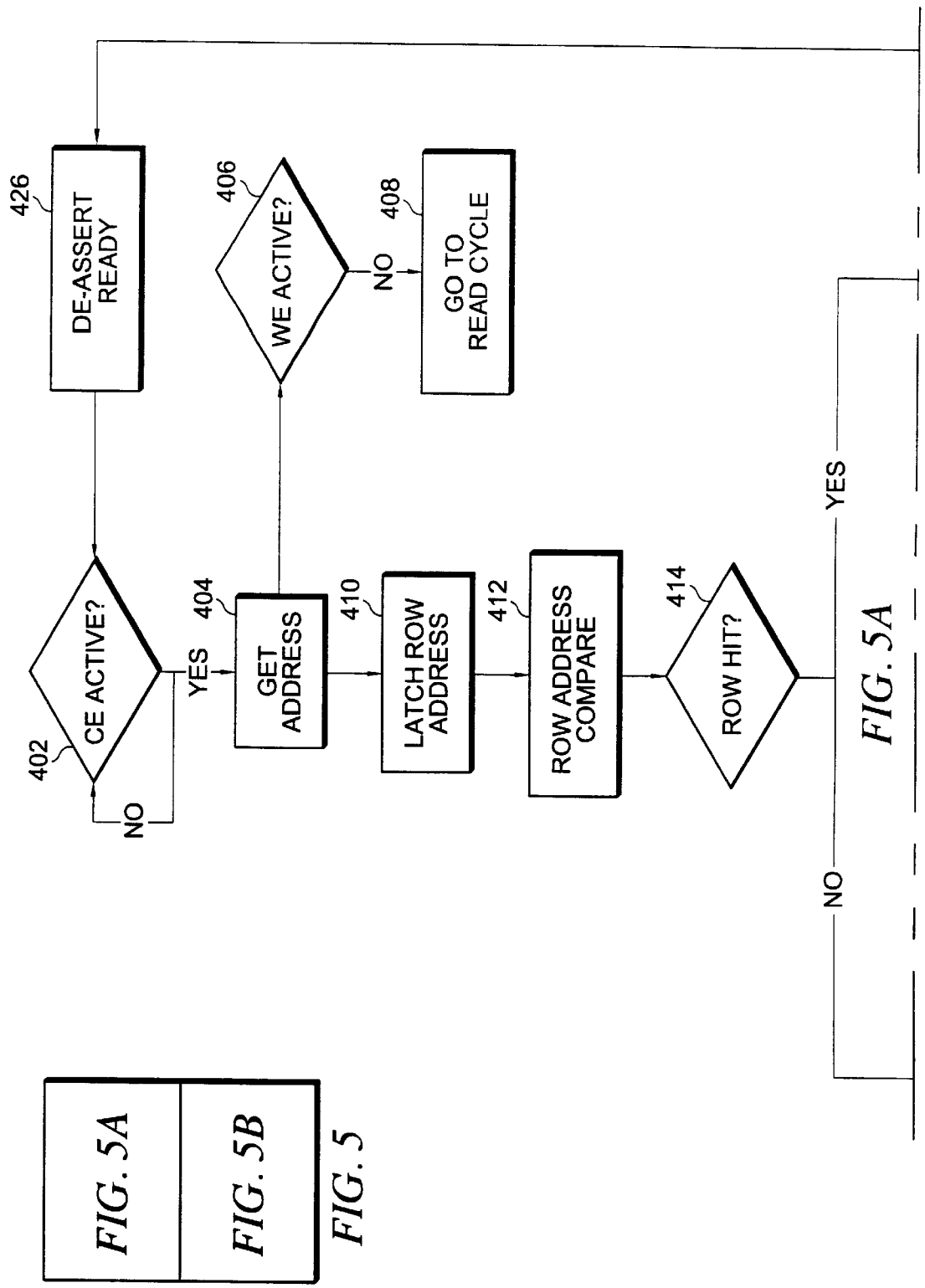

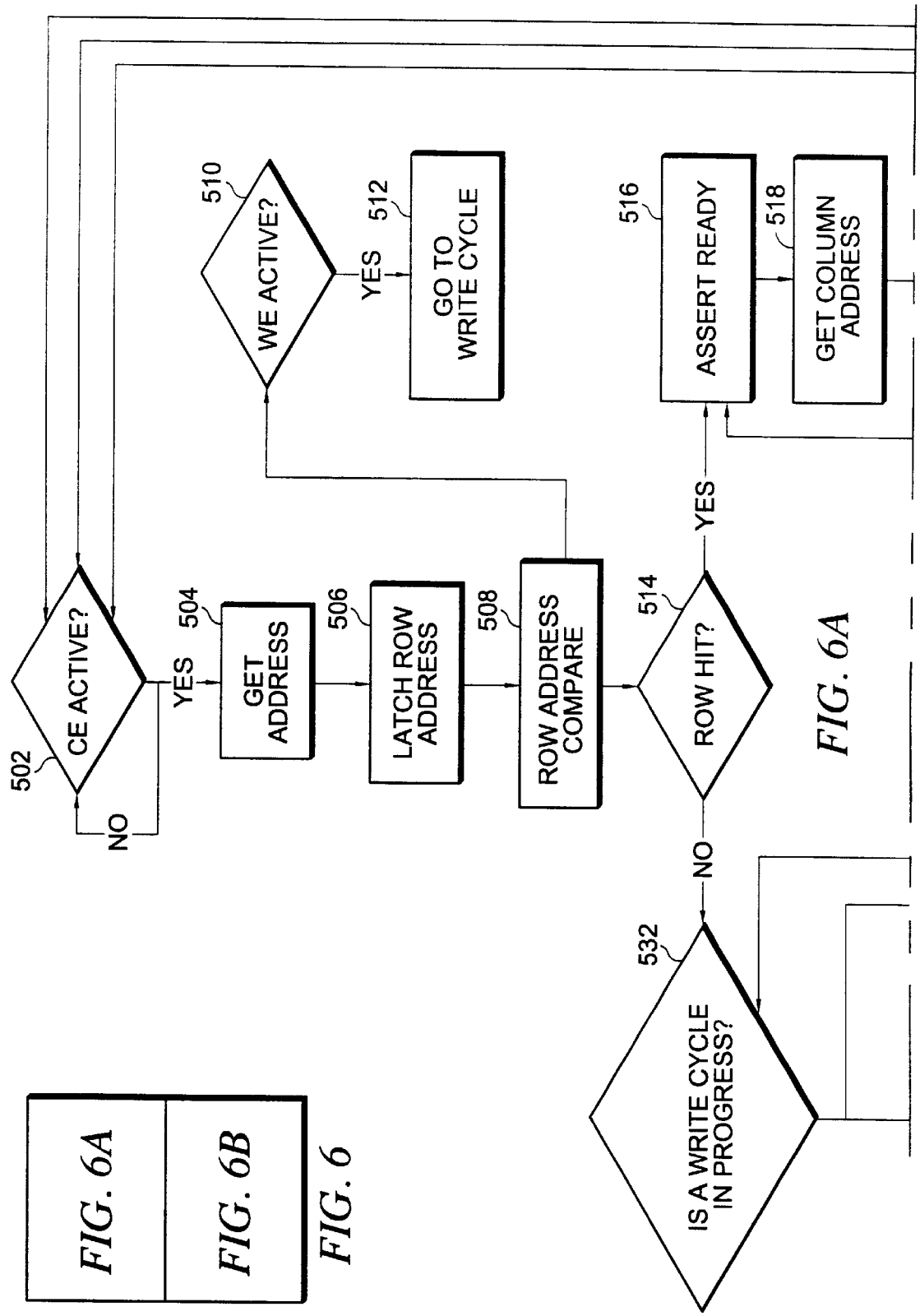

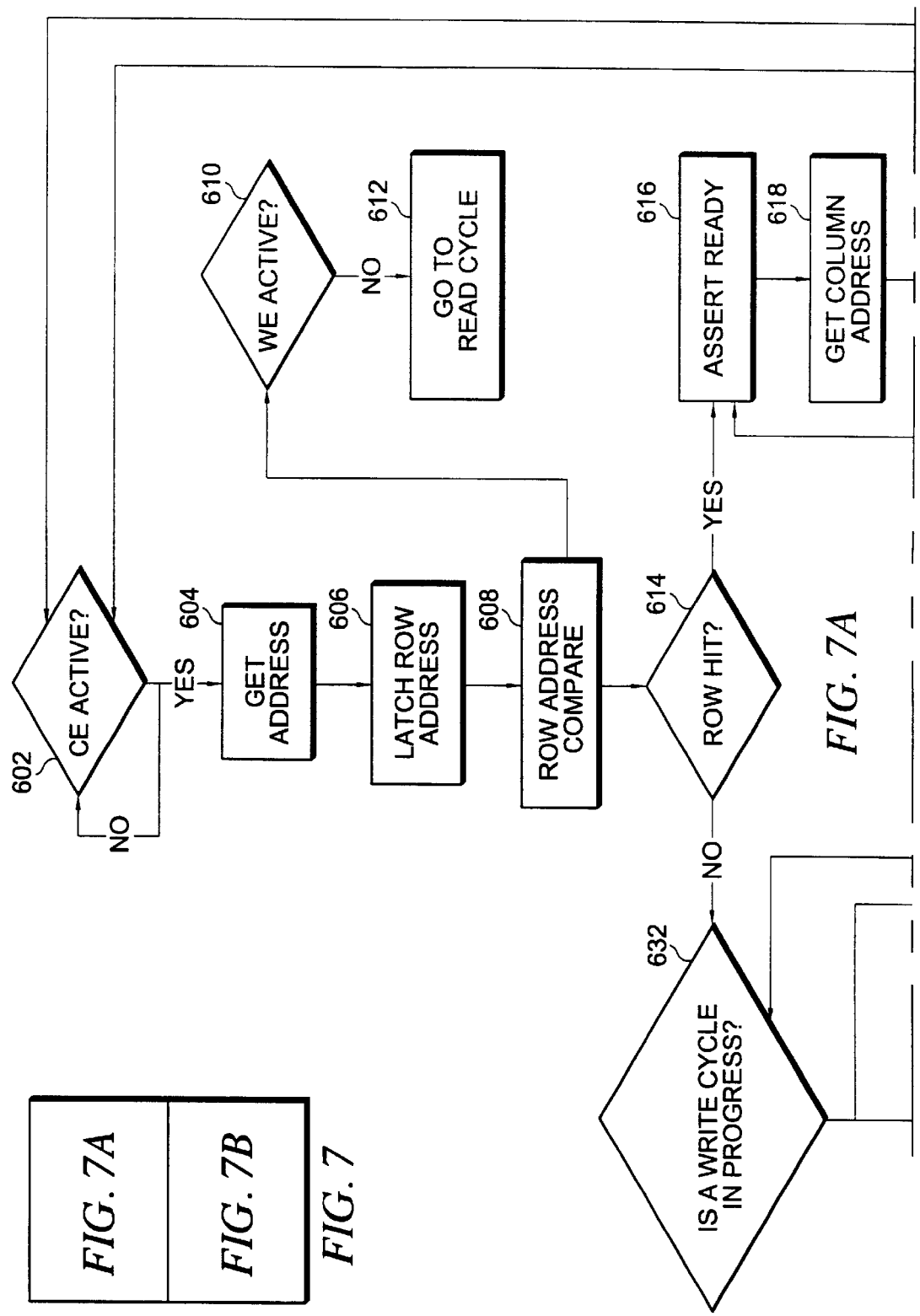

INTEGRATED CIRCUIT MEMORY DEVICE INCORPORATING A NON-VOLATILE MEMORY ARRAY AND A RELATIVELY FASTER ACCESS TIME MEMORY CACHE

CROSS REFERENCE TO RELATED APPLICATIONS

The present invention is related to the subject matter of U.S. Pat. Nos. 5,699,317 and 5,721,862, both assigned to Enhanced Memory Systems, Inc., a subsidiary of Ramtron International Corporation, Colorado Springs, Colo., assignee of the present invention, the disclosures of which are herein specifically incorporated by this reference.

BACKGROUND OF THE INVENTION

The present invention relates, in general, to the field of non-volatile integrated circuit ("IC") memory devices. More particularly, the present invention relates to an integrated circuit memory device incorporating a non-volatile memory array and a relatively faster access time memory cache integrated monolithically therewith.

As the performance of computer central processing units ("CPUs") has increased dramatically in recent years, this performance improvement has far exceeded that of any corresponding increase in the performance of computer main memory. Typically, main memory has been made up of numbers of asynchronous dynamic random access memory ("DRAM") integrated circuits and it was not until the introduction of faster static random access memory ("SRAM") cache memory that the performance of systems with DRAM main memory improved. This performance improvement was achieved by making a high speed locally-accessed copy of memory available to the CPU so that even during memory accesses, the CPU would not always need to operate at the slower speeds of the system bus and the main memory DRAM. This method of copying memory is referred to as "caching" a memory system and is a technique made possible by virtue of the fact that much of the CPU accesses to memory is directed at localized memory address regions. Once such a region is copied from main memory to the cache, the CPU can access the cache through many bus cycles before needing to refresh the cache with a new memory address region. This method of memory copying is advantageous in memory Read cycles which, in contrast to Write cycles, have been shown to constitute 90% of the external accesses of the CPU.

As mentioned previously, the most popular hardware realization of a cache memory employs a separate high-speed SRAM cache component and a slower but less expensive DRAM component. A proprietary Enhanced DRAM (EDRAM®) integrated circuit memory device, developed by Enhanced Memory Systems, Inc., integrates both of these memory elements on one chip along with on-chip tag maintenance circuitry to further enhance performance of computer main memory over separate SRAM and DRAM components. Access to the chip is provided by a single bus. Details of the EDRAM device are disclosed and claimed in the aforementioned United States patents.

DRAM memory devices are designed utilizing a volatile, dynamic memory cell architecture, typically with each cell comprising a single transistor and capacitor. They are "volatile" in the sense that upon powerdown, the memory contents are lost and "dynamic" in the sense that they must be constantly refreshed to maintain the charge in the cell capacitor. The refresh operation is accomplished when the memory contents of a row of cells in the memory array is read by the sense amplifiers and the logic states in the cells that have been read are amplified and written back to the cells. As mentioned previously, DRAM is used primarily for memory reads and writes and is relatively inexpensive to produce in terms of die area. It does, however, provide relatively slow access times.

On the other hand, SRAM devices are designed utilizing a volatile static memory cell architecture. They are considered to be "static" in that the contents of the memory cells need not be refreshed and the memory contents may be maintained indefinitely as long as power is supplied to the device. The individual memory cells of an SRAM generally comprise a simple, bi-stable transistor-based latch, using four or six transistors, that is either set or reset depending on the state of the data that was written to it. SRAM provides much faster read and write access time than DRAM and, as previously mentioned, is generally used as a memory cache. However, because the individual memory cell size is significantly larger, it is much more expensive to produce in terms of on-chip die area than DRAM and it also generates more heat. Typical devices cost three to four times that of DRAM.

In contrast to DRAM and SRAM, various types of non-volatile memory devices are also currently available, by means of which data, can be retained without continuously applied power. These include, for example, erasable programmable read only memory ("EPROM") devices, including electrically erasable ("EEPROM") devices, and Flash memory. While providing non-volatile data storage, their relatively slow access times (and in particular their very slow "write" times) present a significant disadvantage to their use in certain applications.

In contrast, ferroelectric memory devices, such as the FRAM® family of solid state, random access memory integrated circuits available from Ramtron International Corporation provide non-volatile data storage through the use of a ferroelectric dielectric material which may be polarized in one direction or another in order to store a binary value. The ferroelectric effect allows for the retention of a stable polarization in the absence of an applied electric field due to the alignment of internal dipoles within the Perovskite crystals in the dielectric material. This alignment may be selectively achieved by application of an electric field which exceeds the coercive field of the material. Conversely, reversal of the applied field reverses the internal dipoles.

Data stored in a ferroelectric memory cell is "read" by applying an electric field to the cell capacitor. If the field is applied in a direction to switch the internal dipoles, more charge will be moved than if the dipoles are not reversed. As a result, sense amplifiers can measure the charge applied to the cell bit lines and produce either a logic "1" or "0" at the IC output pins. In a conventional two transistor/two capacitor ("2C/2T") ferroelectric memory cell, (one transistor/one capacitor "1T/1C" devices have also been described) a pair of data storage elements are utilized, each polarized in opposite directions. To "read" the state of a 2T/2C memory cell, both elements are polarized in the same direction and the sense amps measure the difference between the amount of charge transferred from the cells to a pair of complementary bit lines. In either case, since a "read" to a ferroelectric memory is a destructive operation, the correct data is then restored to the cell during a precharge operation.

In a simple "write" operation, an electric field is applied to the cell capacitor to polarize it to the desired state. Briefly, the conventional write mechanism for a 2T/2C memory cell includes inverting the dipoles on one cell capacitor and holding the electrode, or plate, to a positive potential greater than the coercive voltage for a nominal 100 nanosecond ("nsec.") time period. The electrode is then brought back to circuit ground for the other cell capacitor to be written for an additional nominal 100 nsec.

In light of the foregoing, it would be highly advantageous to provide a non-volatile memory device that provides the traditional benefits of non-volatile memory retention in the absence of applied power yet also provides the enhanced access times approaching that of other memory technologies when utilized as an on-chip integrated cache in conjunction with a non-volatile memory array.

SUMMARY OF THE INVENTION

Disclosed herein is an integrated circuit memory device incorporating a non-volatile memory array and a relatively faster access time memory cache integrated monolithically therewith which improves the overall access time in page and provides faster cycle time for read operations. In a particular embodiment, the cache may be provided as SRAM and the non-volatile memory array provided as ferroelectric random access memory (for example, FRAM®) wherein on a read, the row is cached and the write back cycle is started allowing subsequent in page reads to occur very quickly. If in page accesses are sufficient the memory array precharge in a ferroelectric based memory array may be hidden and writes can occur utilizing write back or write through caching. In alternative embodiments, the non-volatile memory array may comprise EPROM, EEPROM or Flash memory in conjunction with an SRAM cache or a ferroelectric random access memory based cache (for example, FRAM®) which has symmetric read/write times and faster write times than EPROM, EEPROM or Flash memory.

Particularly disclosed herein is a memory device comprising a non-volatile memory array. The device includes an address bus for receiving row and column address signals for accessing specified locations within the memory array and a data bus for receiving data to be written to a location in the memory array specified by the row and column address signals and for presenting data read from the memory array at a location specified by the row and column address signals. The memory device further comprises a cache associated with the memory array and coupled to the data bus for storing at least a portion of the data to be read from the memory array, the cache having a relatively faster access time than the memory array.

Further disclosed herein is a non-volatile memory device which includes a non-volatile memory array having associated row and column decoders; an address bus for receiving row and column address signals for application to the row and column decoders respectively; a cache interposed between the column decoder and the non-volatile memory array, the cache having a relatively faster access time than the non-volatile memory array; and a data bus coupled to the cache for receiving data to be written to a location in the non-volatile memory array specified by the row and column decoders and for presenting data read from the memory array at a location specified by the row and column decoders.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIGS. 2, 2A, and 2B are a logic flow chart of an exemplary memory device read cycle operation in an embodiment of the present invention utilizing a FRAM technology-based non-volatile memory array and an SRAM-based memory for the cache in a "write back" caching scheme;

FIGS. 3, 3A, and 3B are a corresponding logic flow chart of an exemplary memory device write cycle operation in an embodiment of the present invention corresponding to the embodiment characterized in FIG. 2 utilizing a "write back" caching scheme;

FIGS. 4, 4A, and 4B are a logic flow chart of an exemplary memory device read cycle operation in an embodiment of the present invention utilizing a FRAM technology-based non-volatile memory array and an SRAM-based memory for the cache in a "write through" caching scheme;

FIGS. 5, 5A, and 5B are a corresponding logic flow chart of an exemplary memory device write cycle operation in an embodiment of the present invention corresponding to the embodiment characterized in FIG. 4 utilizing a "write through" caching scheme;

FIGS. 6, 6A, and 6B are a logic flow chart of an exemplary memory device read cycle operation in an embodiment of the present invention utilizing an EEPROM or Flash technology-based non-volatile memory array and an SRAM-based memory for the cache in a "write back" caching scheme; and FIGS. 7, 7A, and 7B are a corresponding logic flow chart of an exemplary memory device write cycle operation in an embodiment of the present invention corresponding to the embodiment characterized in FIG. 6 utilizing a "write back" caching scheme.

DESCRIPTION OF A PREFERRED EMBODIMENT

Figure 1:
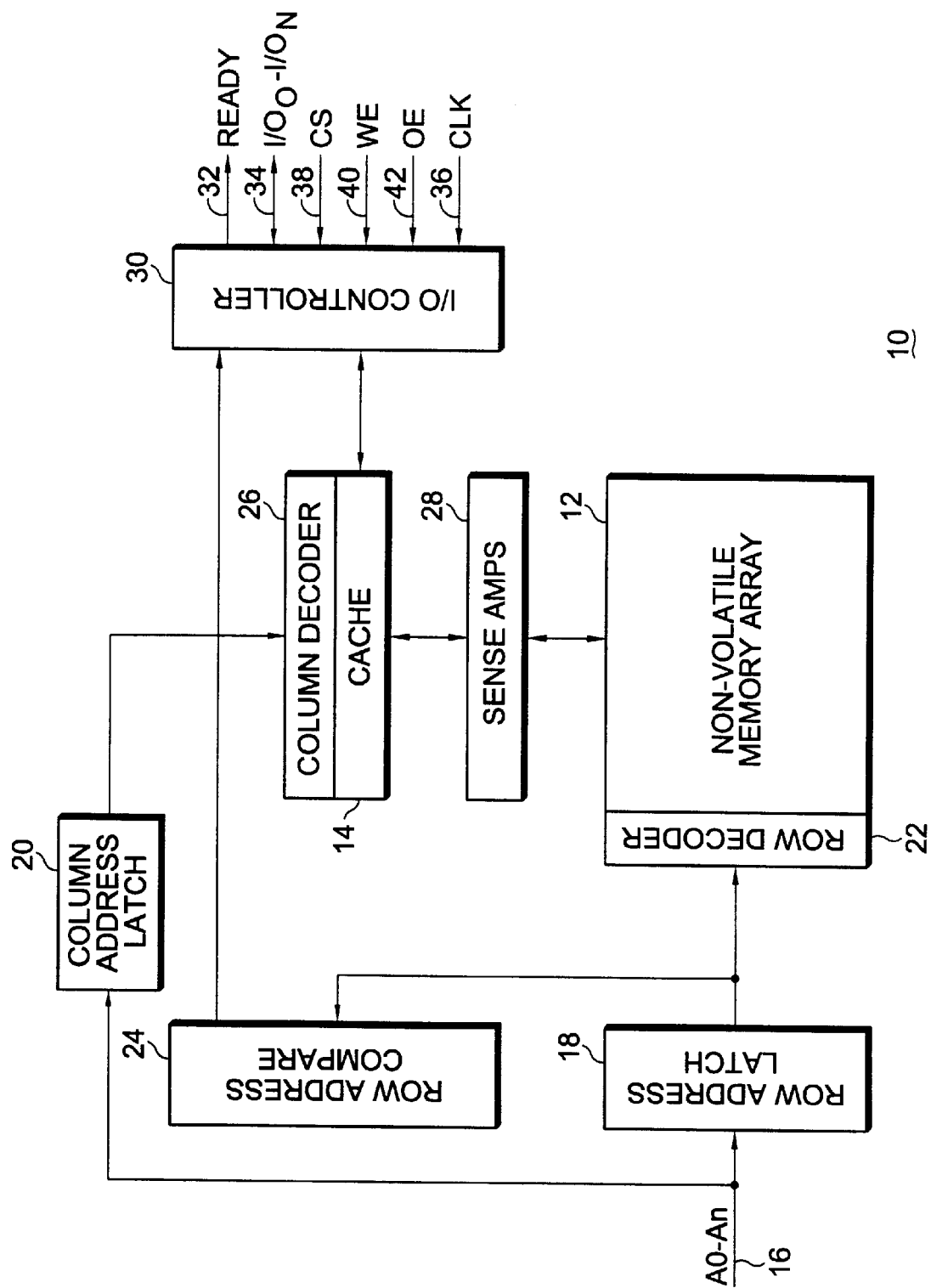
FIG. 1 is a simplified logic block diagram of a representative parallel version of an integrated circuit memory device incorporating a non-volatile memory array and a relatively faster access time memory cache in accordance with the present invention.

With reference now to FIG. 1, a simplified logic block diagram of a representative integrated circuit memory device 10 incorporating a non-volatile memory array 12 and a relatively faster access time memory cache 14 in accordance with the present invention is shown. It should be noted that although a parallel memory device 10 has been illustrated, the principles of the present invention are likewise applicable to those incorporating a serial data bus as well as synchronous devices.

The exemplary memory device 10 illustrated is accessed by means of an external address bus 16 comprising a number of address lines $A_0$ through $A_n$ inclusive. The address bus is applied to a row address latch 18 as well as a column address latch 20. The row address latch 18 and column address latch 20 are operative to respectively maintain a row and column address for accesses to the non-volatile memory array 12. The output of the row address latch 18 is supplied directly to a row decoder 22 associated with the non-volatile memory array 12 for accessing a specified row therein as well as to a row address compare block 24. The output of the column address latch 20 is supplied to a corresponding column decoder 26 for accessing a specified column of the non-volatile memory array 12 as determined by that portion of the address signal supplied to the address bus 16 maintained in the column address latch 20.

As shown, the cache 14 may be interposed between the column decoder 26 and a number of sense amplifiers 28 bi-directionally coupling the column decoder and the non-volatile memory array 12. In a specific embodiment of the present invention, the cache 14 may comprise a row of SRAM registers for maintaining a last row read ("LRR") from the non-volatile memory array 12, which itself may be constructed utilizing FRAM technology memory cells. In a particular embodiment of the present invention, the cache 14 may be rendered essentially non-volatile through the use of a pair of FRAM memory cells associated with SRAM memory cells as disclosed in U.S. Pat. No. 4,809,225 assigned to Ramtron International Corporation, the disclosure of which is herein incorporated by this reference.

An input/output ("I/O") decoder (or controller) 30 is coupled to an output of the row address compare block 24 and is bi-directionally coupled to the cache 14. The I/O decoder 30 presents an external "Ready"(or "Not Ready" signal, either of which might be active "high" or active "low") on line 32. Data output from, (i.e. "Q") or data to be written to, (i.e. "D") the memory device 10 is handled by means of an input/output ("I/O") bus 34 which may comprise any number of bi-directional signal lines $I/O_0$ through $I/O_N$. In a serial implementation the "Q" and "D" signals would be separate outputs and inputs respectively. An externally supplied chip select ("CS")signal on line 38, write enable ("WE") signal on line 40 and output enable ("OE") signal on line 42 are also supplied to the memory device 10 through the I/O decoder 30. In a synchronous embodiment of the memory device 10, an external clock signal ("CLK") may be supplied on an optional clock line 36.

In the particular embodiment shown, data is read from and written to the non-volatile memory array 12 through the cache 14. In other implementations of the memory device 10 of the present invention, it may be advantageous to write all data directly to the non-volatile memory array 12 while reading all data from the cache 14 as it is written to the cache 14 from the non-volatile memory array 12.

The operation of the exemplary memory device 10 will be explained in greater detail hereinafter with respect to "write back" and "write through" caching schemes in conjunction with an FRAM memory cell technology-based non-volatile memory array 12 with an associated SRAM cache 14 as well as with an EEPROM or Flash technology-based non-volatile memory array 12 utilizing a similar cache 14. It should also be noted that, since FRAM memory cell read and write times are symmetric, and the latter time is significantly faster than that of EEPROM or Flash, the principles of the present invention are likewise applicable to an EEPROM, Flash or other non-volatile memory array 12 utilizing FRAM memory cells for the cache 14.

As stated previously, access and control is accomplished via, an address bus 16 ($A_0$–$A_n$), the I/O bus 34, chip select (or chip enable) line 38 ("CS" or "CE"), a write enable line 40 ("WE"), an output enable line 42 ("OE") and a Ready line 32. The row address compare block 24 and Ready line 32, signal the user when data is present in the row register, or cache 14, and a fast access is practicable. This function may be implemented externally (by the user) but inclusion as a portion of the memory device 10 has certain advantages. Alternative access and control schemes (i.e. multiplexed addresses, burst counters, read only, common I/O, etc.) are also within the contemplation of the present invention.

As also previously noted, the use of FRAM memory cells for the non-volatile memory array 12 supports a much faster write cycle then does either Flash or EEPROM and therefore both "write through" and "write back" caching mechanisms might be utilized depending on the particular application. The following discussion describes the logical control for a memory device 10 for each of these technologies in a single bank implementation, although it should be noted that the principles of the present invention are likewise applicable to multiple non-volatile memory array 12 banks within a given memory device 10.

Figure 2B:
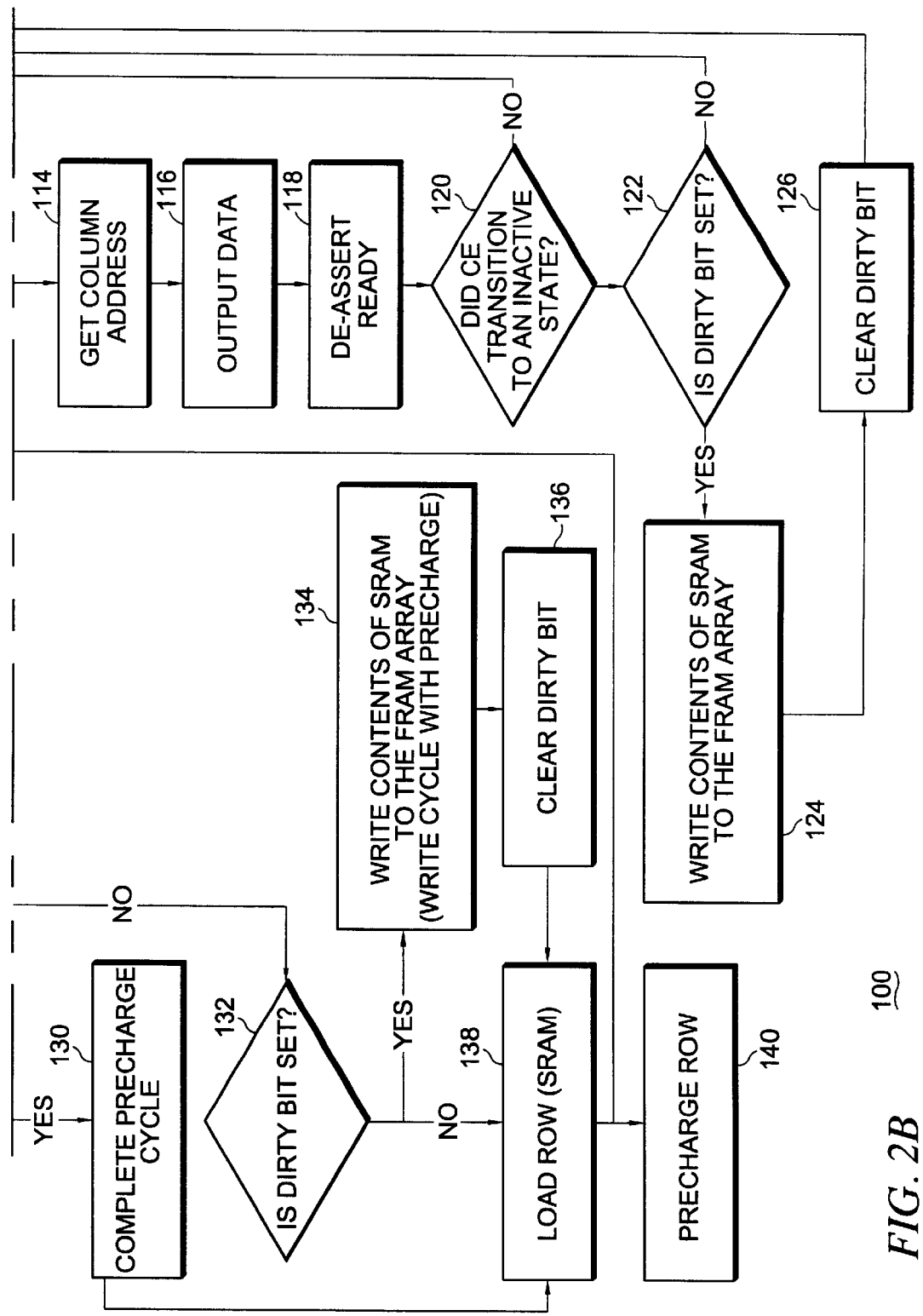

With reference additionally now to FIG. 2, the operation of a particular implementation of a memory device 10 in accordance with the present invention is shown for a read operation utilizing an FRAM memory cell based non-volatile memory array 12 in a write back caching scheme. A write back operation is contemplated wherein all accesses to the memory device 10 are made via the SRAM cache 14. The contents of the cache 14 is only written to the non-volatile memory array 12 on a row "miss" or if the chip select (or chip enable "CE") line 38 transitions to an inactive state ( i.e. the memory device 10 is deactivated). The control logic must, therefore, know if the cache 14 has been written for which the embodiment of the present invention shown sets a ""dirty" bit" if a write has occurred.

Write Back Caching with FRAM Memory Array

The SRAM row cache 14 also allows for reads from the cache 14 while a precharge cycle is completed. (The current implementation of FRAM memory cell based memories inverts the data in the memory cell to determine the state. The data is written back to the cell during the precharge cycle. If the previous cycle had been a read "miss", the precharge cycle could be in progress. Accesses to the non-volatile memory array 12 cannot be performed until the cycle is complete. In future implementations of ferroelectric memories this may no longer be necessary and, therefore, these delays could be eliminated.) This will reduce the cycle time in applications where reads are either local or sequential (cache "hit"s).

As shown, the memory device 10 operation begins with the chip enable (or chip select) line 38 going active (either active "high" or active "low" as a design choice) and depends on the state of the cache 14 ("dirty" or "clean") and the operation preceding the cycle.

Read Cycle

The process 100 begins with the memory device 10 in a standby mode until the CE line 38 becomes active at decision step 102. The address on the address bus 16 is detected at step 104 and latched at step 106. A read or write cycle is determined by the state of write enable line 40 at decision step 142 following a row address compare step 108. If at decision step 142 the WE line 40 is active, the process 100 proceeds to a write cycle as will be more fully described hereinafter with respect to FIG. 3.

The read cycle is preceded by a page (row) detect operation at decision step 110 to determine if the data is in the cache 14 (row register). If the address is in the cache (a read "hit"), the Ready line 32 is asserted at step 112, the column address is acquired at step 114, the appropriate data is output at step 116, the Ready signal on line 32 is de-asserted at step 118 (after a predetermined delay). At this point the memory device 10 will wait for a new valid address or a transition of the chip enable line 38 to an inactive state at decision step 120. If the chip enable line 38 has gone inactive, the "dirty" bit is checked at decision step 122. If the cache 14 is "dirty", it is written back at step 124 to the non-volatile memory array 12 (if a precharge cycle is in progress, it must complete before the write back begins), and the "dirty" bit is cleared at step 126. This maintains coherency between the contents of the cache 14 and the non-volatile memory array 12 should a power down cycle occur before the CE line 38 becomes active again. The memory device 10 then waits for the chip enable line 38 to become active at decision step 102. If the chip enable line 38 remains active, the memory device 10 waits for a valid address at step 104.

In a read "miss", the memory device 10 again remains in standby until CE becomes active at decision step 102. The address is detected at step 104 and latched at step 106. A read or write cycle is determined by the state of write enable line 40 as previously described. The read cycle is preceded by a page (row) detect at decision step 110 to determine if the data is in the cache 14. Since the address is not in the cache 14 (a read "miss"), it must be determined if a precharge cycle is in progress at decision step 128. When the precharge cycle is completed at step 130, a new row is loaded in the cache 138, the Ready line 32 is asserted at step 112, the column address is acquired at step 114, the precharge cycle is initiated at step 140 in parallel, the data is output at step 116, the Ready line 32 is de-asserted at step 118 after a specified delay, and the memory device waits for a CE line 38 transition at step 120 or a valid address at step 104. If the CE line 38 transitions, it is handled as previously described with respect to a read "hit". If a precharge cycle at decision step 128 is not in progress, the "dirty" bit is checked at decision step 132 to see if the cache 14 had been previously written. If the cache 14 is "clean", the cache 14 is loaded at step 138 and the process 100 proceeds as previously described. Alternatively, if the cache 14 is "dirty", the contents of the cache 14 are written back to the non-volatile memory array 12 at step 134 (full cycle including precharge), the "dirty" bit is cleared at step 136, the cache 14 is loaded at step 138, the Ready line 32 is asserted at step 112 and the process 100 proceeds as hereinbefore described.

Write Cycle

Figure 3A:
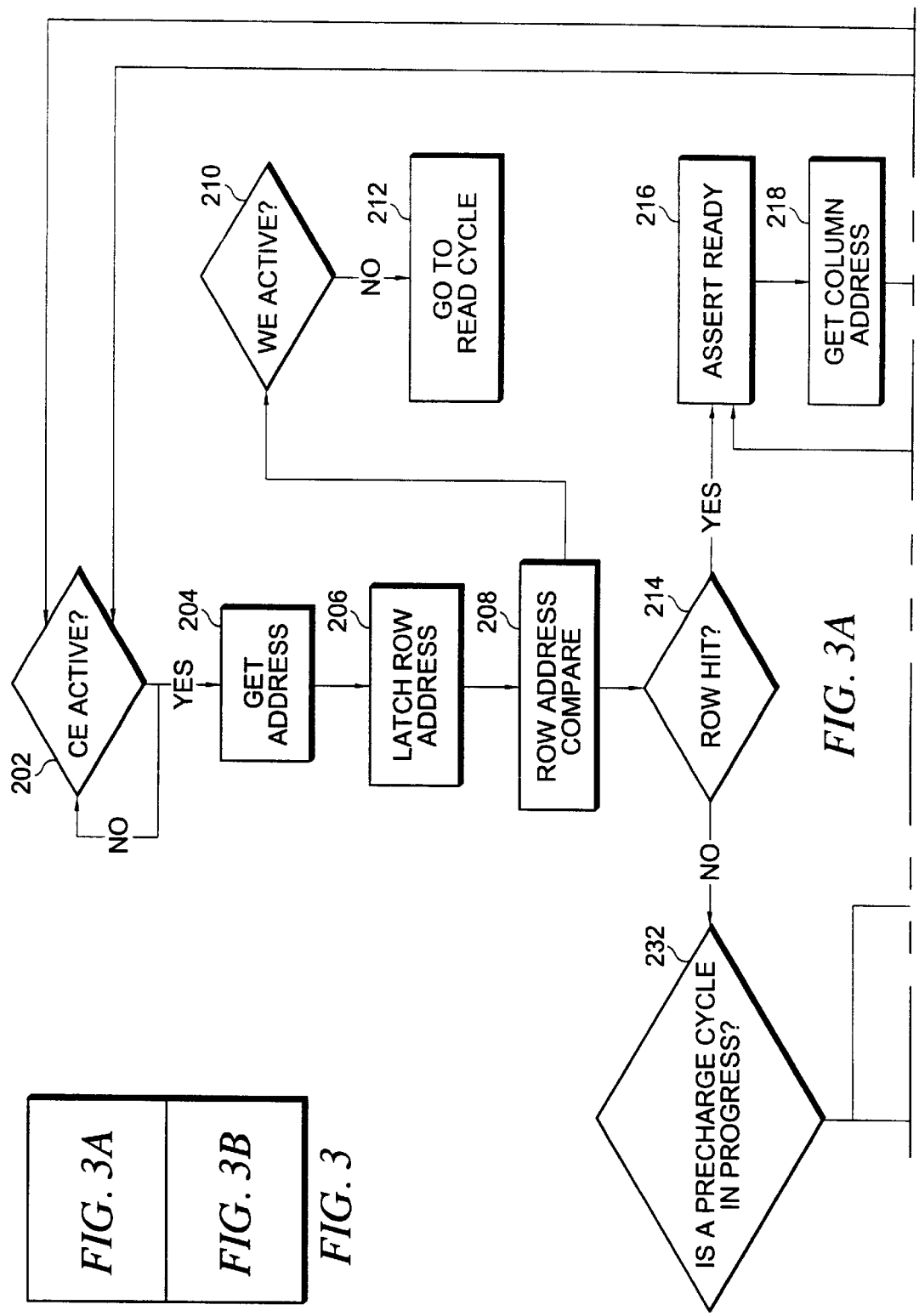
Figure 3B:
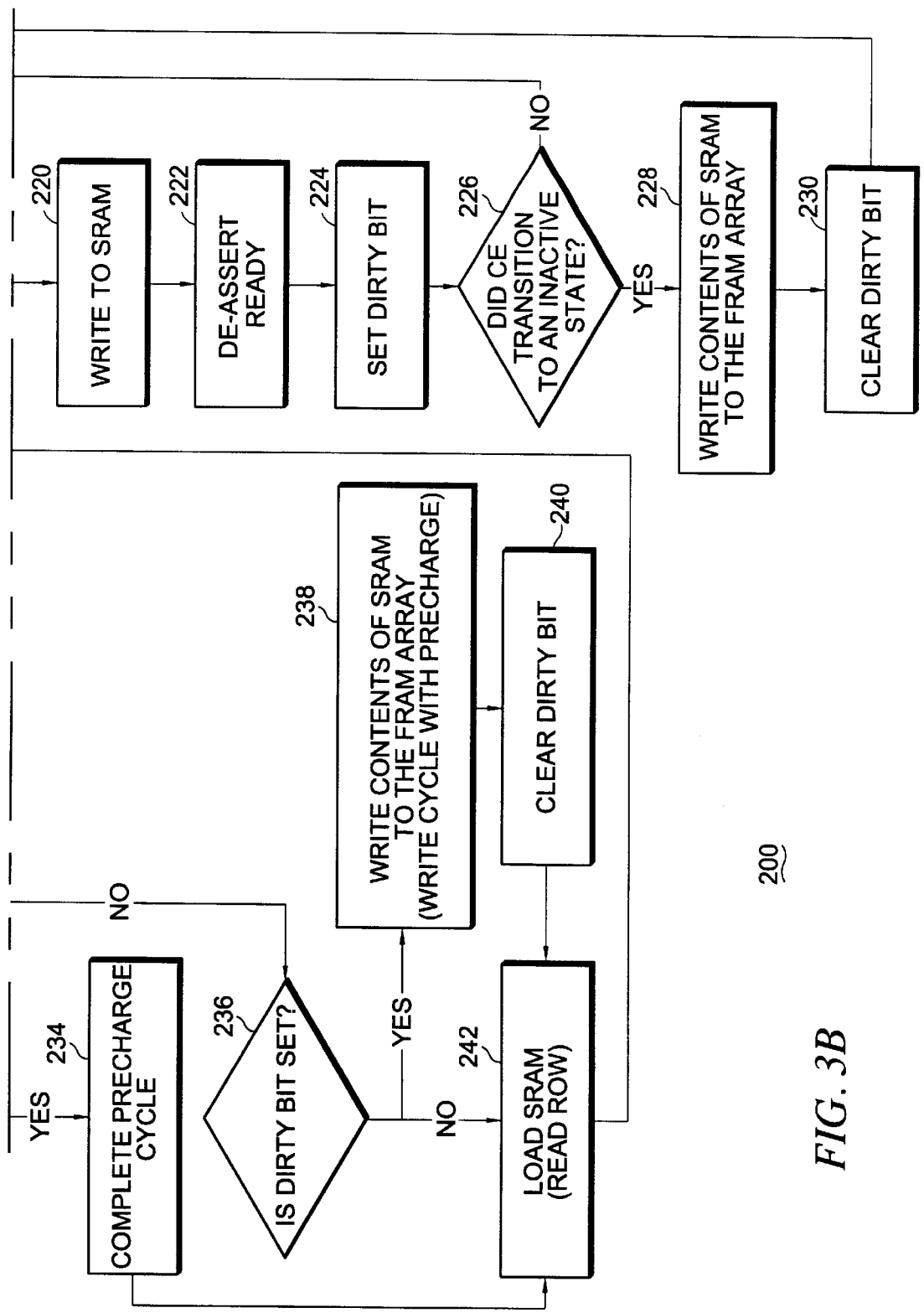

With reference additionally now to FIG. 3, a write cycle process 200 is shown. In a write "hit" mode of operation, the memory device 10 is in standby until CE line 38 becomes active at decision step 202. The address is detected at step 204 and latched at step 206. A read or write cycle is determined by the state of the write enable line 40, and if it is not active at decision step 210, a read cycle is entered at step 212. The write cycle is preceded by a page detect operation at a row address compare step 208. If the address is in the cache 14 at decision step 214 (i.e. a cache "hit") the Ready line 32 is asserted at step 216, the column address is acquired at step 218, the data is written to the cache 14 at step 220, the Ready line 32 is de-asserted at step 222 and the "dirty" bit is set at step 224. At this point, the memory device 10 will wait for a new valid address or for the chip enable line 38 to transition to an inactive state at decision step 226. If the chip enable line becomes inactive, the contents of the cache 14 are written back to the non-volatile memory array 12 at step 228. (if a precharge cycle is in progress it must complete before the write back begins), and the "dirty" bit is cleared at step 230 and process 200 proceeds as previously described with respect to a Read Cycle.

With respect to a write miss, the memory device 10 waits for an active chip enable at decision step 202 and a valid address at step 204. As before, a write cycle is determined by the state of write enable line 40. The address is latched at step 206 and compared at step 208. If the address is not in the cache 14, it must then be determined if a precharge cycle is in progress at decision step 232. If the precharge cycle is in progress, it must be allowed to complete at step 234 before loading the cache 14 at step 242, the Ready line 32 is asserted at step 216 and the process flow 200 completes as previously described. If a precharge is not in progress, the "dirty" bit is checked at step 236. If the cache 14 is "clean", the new row is loaded into the cache 14 at step 242, the Ready line 32 is asserted at step 216 and the process 200 completes as described. If the "dirty" bit is set at decision step 236, the contents of the cache 14 are written back to the non-volatile memory array 12 at step 238 and the process 200 completes as previously described.

Write Through Caching with FRAM Memory Array

Non-volatile memory devices utilizing FRAM memory cells may benefit some applications using a write through mechanism. The writes in this case will go directly to the non-volatile memory array 12 or to the cache 14 and the non-volatile memory array 12 in the event of a cache "hit". The control in this instance is similar to that of the previously described write back case except there is no analogous write "hit". Writes to the non-volatile memory array 12 will always require the access time of the FRAM array.

Read Cycle

Figure 4B:
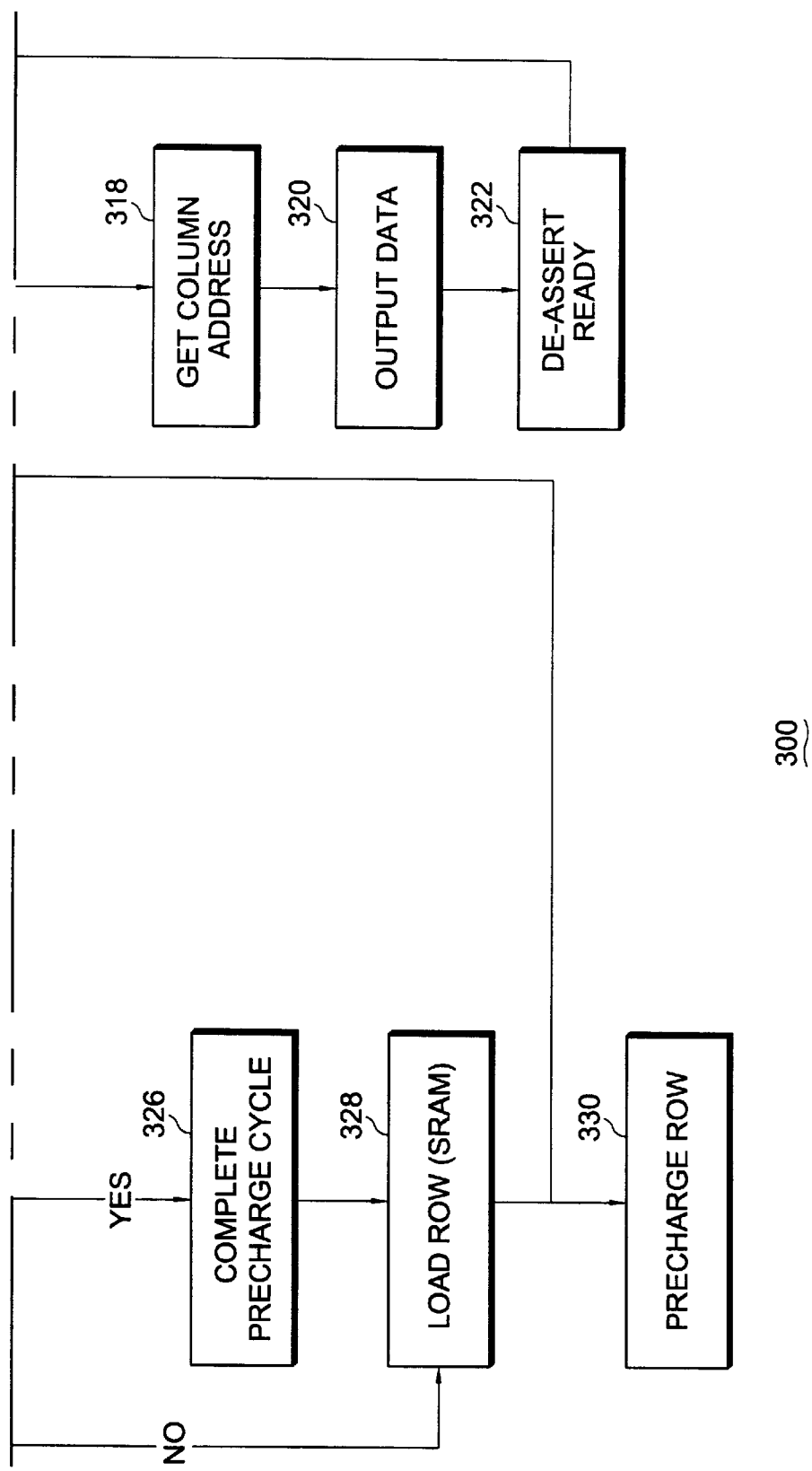

With reference additionally now to FIG. 4, a read process 300 is shown. In a read "hit", the memory device 10 is in standby until CE line 38 becomes active at decision step 302. The address is detected at step 304 and latched at step 310. A read or write cycle is determined by the state of the write enable line 40 at decision step 306, and if it is active, then the process 300 proceeds to a write cycle at step 308. The read cycle is preceded by a page (row) detect at step 312 to see if the data is in the cache 14. If the data is in the cache 14, the Ready line 32 is asserted at step 316, the column address is acquired at step 318, the data is output on I/O bus 34 at step 320 and the Ready line is de-asserted at step 322 (after a predetermined delay). The memory device 10 then waits for an active CE line 38 at decision step 302 and a valid address at step 304.

In a read "miss" operation, the memory device 10 will remain in standby until the CE line 38 becomes active at decision step 302. The address is detected at step 304 and latched at step 310 as before. A read or write cycle is determined by the state of the write enable line 40. As previously described, the read cycle is preceded by a page (row) detect at decision step 314 to determine if the data is in the cache 14. Since the data is not in the cache in the case of a read miss, it must be determined if a precharge cycle is in progress at decision step 324. If the precharge cycle is completed, a new row is loaded in the cache 14 at step 328, the Ready line 32 is asserted at step 316, the column address is acquired at step 318, the precharge cycle is initiated at step 330 in parallel, the data is output at step 320, the Ready line 32 is de-asserted at step 322 (following a predetermined delay) and the memory device 10 again waits for the CE line 38 to become active at decision step 302 (if CE is active for another valid address) followed by a valid address at step 304.

Write Cycle

Figure 5B:
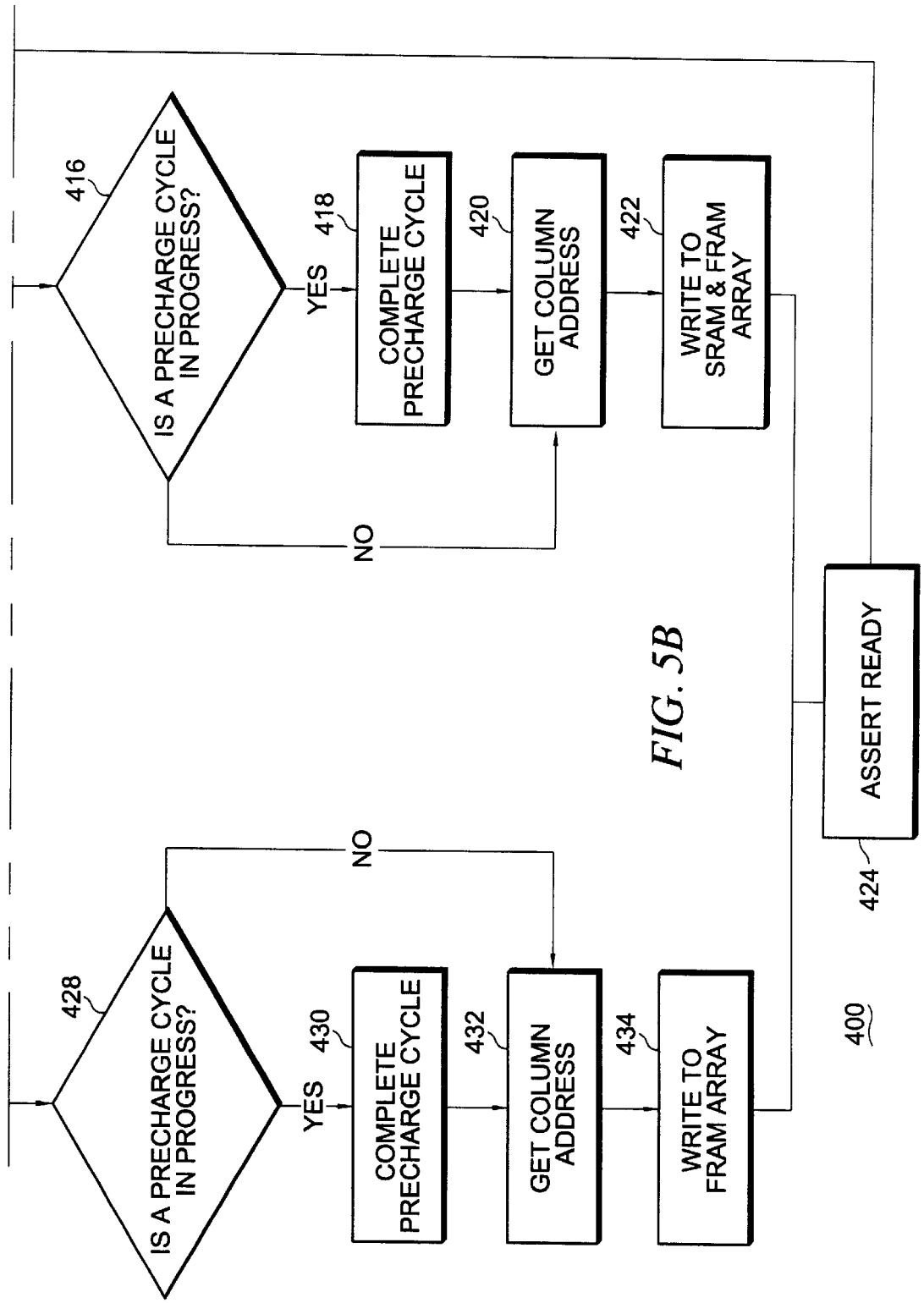

With reference additionally now to FIG. 5, a write process 400 for a write through mode of operation is shown. Writes are written to the non-volatile memory array 12 directly and begin with an active chip enable line 38 at decision step 402. The address is detected at step 404 and latched at step 410. If the write enable line 40 is not active at decision step 406, then a read cycle is initiated at step 408. The row address is compared at step 412 to determine if the address is in the cache 14. If the address is in the cache 14 (a row hit) at decision step 414, it must then be determined if a precharge cycle is in progress at decision step 416. If there is no precharge operation in progress, the column address is acquired at step 420, the data is written to the cache 14 and the non-volatile memory array 12 simultaneously at step 422, the Ready line 32 is asserted at step 424 after the access time requirement is met, and the Ready line is de-asserted at step 426 after a specified delay. The memory device 10 then waits for an active chip enable at decision step 402 and a valid address at step 404. If the address is not in the cache 14 at decision step 414 (a row miss), it is determined if a precharge cycle is in progress at decision step 428 and, if so, it completes at step 430, the column address is acquired at step 432, the data is written to the non-volatile memory array only at step 434 (a write through) and the process 400 continues as previously described.

Write Back Caching with EEPROM or Flash Memory Array

A memory device 10 with a direct mapped row cache 14 (i.e. an SRAM Row Register) coupled with either an EEPROM or Flash non-volatile memory array 12 is similar to a memory device 10 utilizing a FRAM memory cell memory array 12 as described with respect to FIGS. 2–5 inclusive, except that the write mechanisms and write speeds are very much different.

The following description in conjunction with the flow charts of the succeeding figures describes the operation of such a memory device 10 using a "write back" caching mechanism.

Read Cycle

Figure 6B:
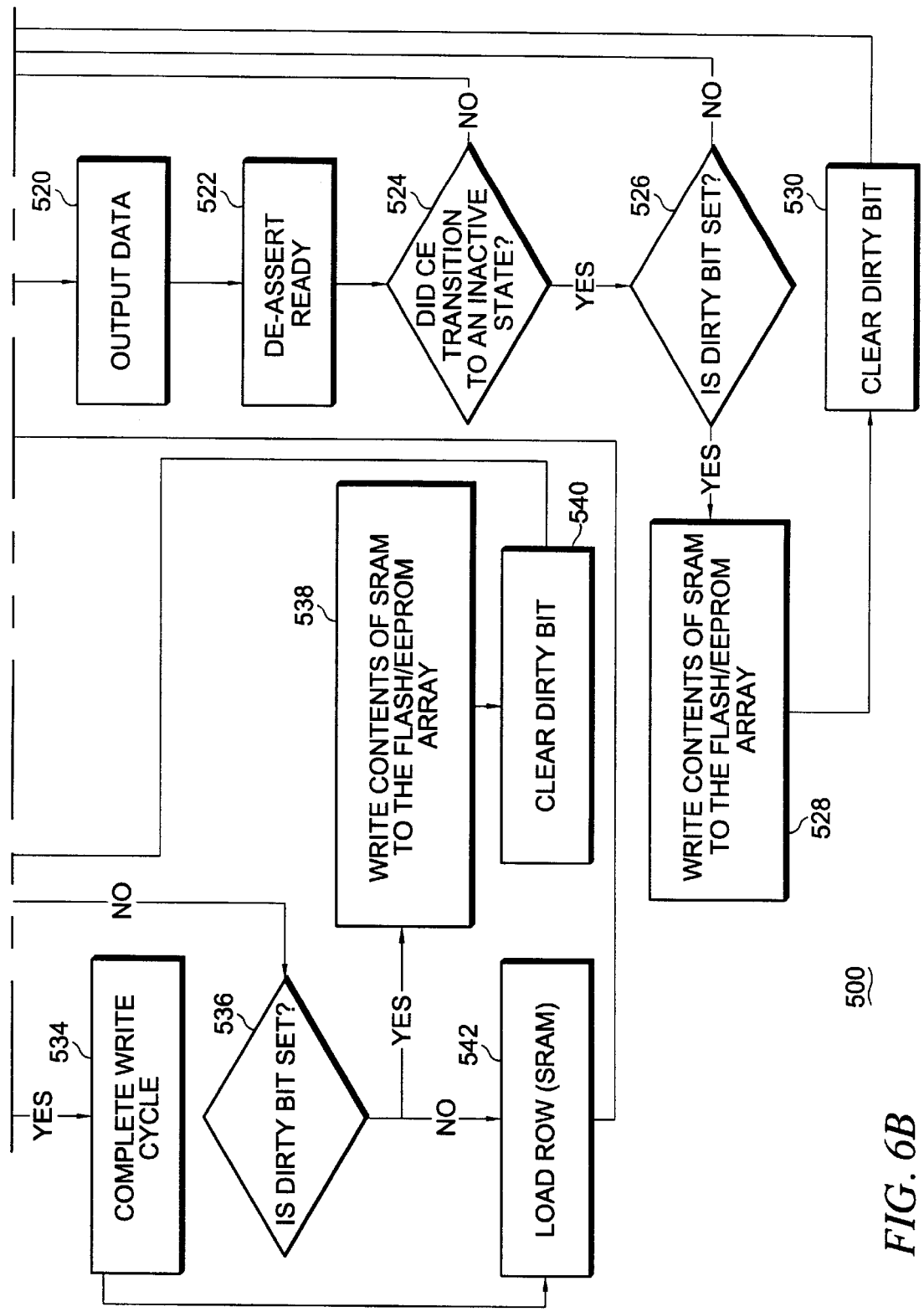

With reference additionally now to FIG. 6, a read process 500 for a write through caching system utilizing EEPROM, Flash or similar technologies for the non-volatile memory array 12 is shown. The memory device 10 will remain in standby until the CE line 38 becomes active at decision step 502. The address is detected at step 504 and latched at step 506 as before. A read or write cycle is determined by the state of the write enable line 40 at decision step 510 and if it is active, the process 500 proceeds to a write cycle at step 512. The read cycle is preceded by a page (row) detect at step 508 to see if the data is in the cache 14 (row register). If the address is in the cache 14 (a read hit) at decision step 514, the Ready line 32 is asserted, the column address is acquired at step 518, the appropriate data is output at step 520 and the Ready line 32 is de-asserted at step 522 (after a predetermined delay). At this point, the memory device 10 will wait for a new valid address or a transition of the chip enable line 38 to an inactive state. If the chip enable line 38 has transitioned to an inactive state at decision step 524, the "dirty" bit is checked at decision step 526. If the cache 14 is "dirty", it is written back at step 528 to the EEPROM/Flash non-volatile memory array 12, and the "dirty" bit is cleared at step 530. This maintains coherency should a power down cycle occur before the CE line 38 becomes active again. The memory device 10 then waits for the chip enable line 38 to become active at decision step 502. If the chip enable line 38 remains active, the memory device 10 waits for a valid address at step 504.

In a read miss operation, the memory device 10 will remain in standby until the CE line 38 becomes active at decision step 502, the address is detected at step 504 and latched at step 506. As before, a read or write cycle is determined by the state of the write enable line 40. The read cycle is preceded by a page (row) detect step 508 to determine if the data is in the cache 14 at decision step 514. Since the address is not in the cache 14 (a read miss), it must be determined if a write cycle is in progress at decision step 532. If so, the write cycle is completed at step 534, a new row is loaded in the cache 14 at step 542, the Ready line 32 is asserted at step 516, the column address is acquired at step 518, the data is output at step 520, the Ready line 32 is de-asserted at step 522 after a predetermined delay, and the memory device 10 waits for a CE line 38 transition at step 524 or (if CE line 38 is active) a valid address at step 504. If the CE line 38 transitions, it is handled as previously described.

Alternatively, if a write cycle is not in progress at decision step 532, the "dirty" bit is checked at decision step 536 to determine if the cache 14 had been written previously. If the cache 14 is "clean", the cache 14 is loaded at step 542 and the process 500 completes as aforedescribed. If the cache 14 is "dirty", the contents of the cache 14 are written back to the EEPROM/Flash non-volatile memory array 12 at step 538, the "dirty" bit is cleared at step 540, the write cycle completes at step 534, the cache is loaded at step 542, the Ready line 32 is asserted at step 516 and the memory device 10 returns to wait for an active CE line at decision step 502 and a valid address at step 504.

Write Cycle

Figure 7B:
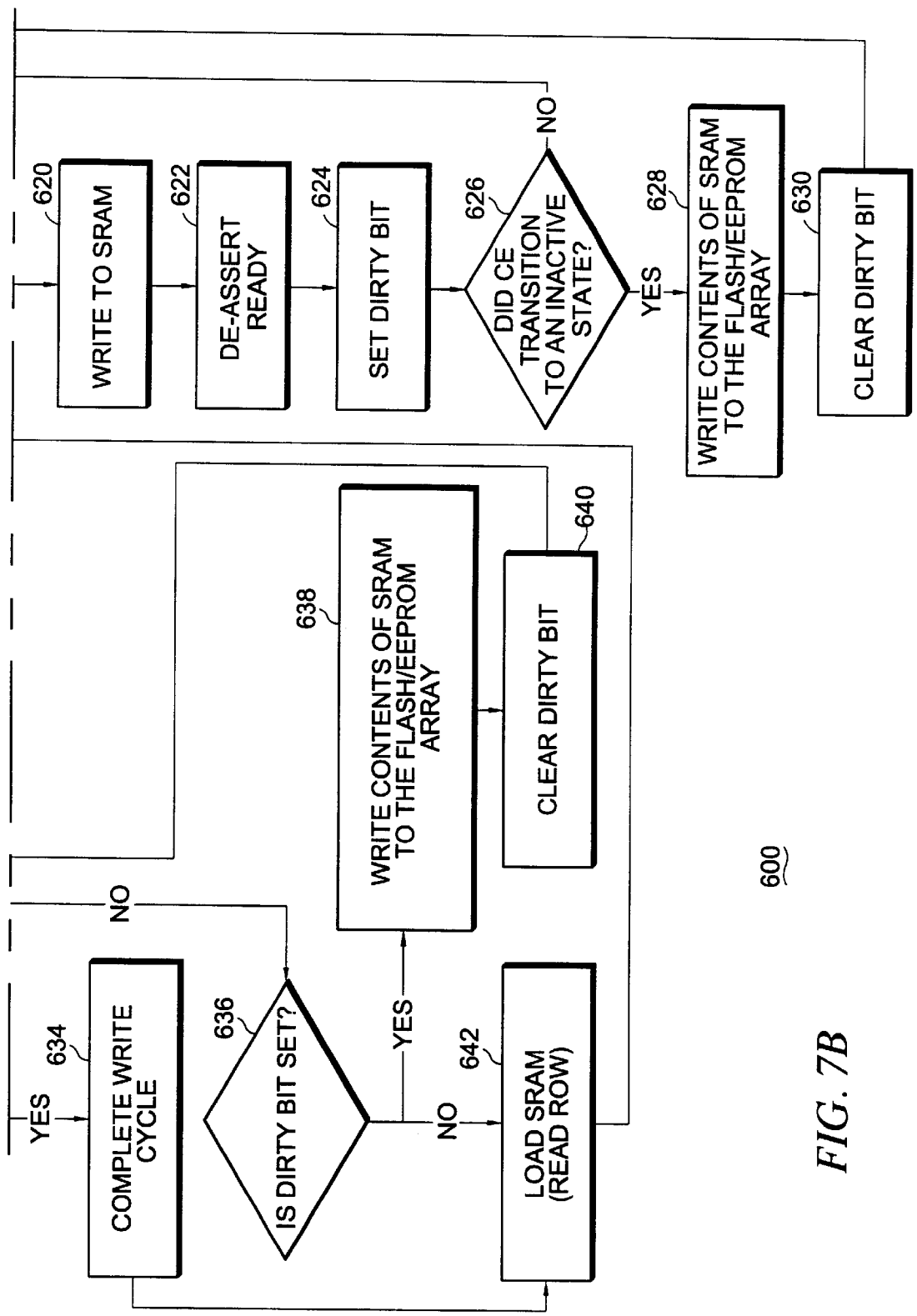

With reference additionally now to FIG. 7, a write process 600 is shown. In a write "hit" mode of operation, the memory device 10 remains in standby until the CE line 38 becomes active at decision step 602. The address is detected at step 504 and latched at step 606. A read or write cycle is determined by the state of write enable line 40 at decision step 610, and if it is not active, a read cycle is entered at step 612. The write cycle is preceded by a page detect at step 608. If the address is in the cache 14 at decision step 614, the Ready line 32 is asserted at step 616, the column address is acquired at step 618, the data is written to the cache 14 at step 620, the Ready line 32 is de-asserted at step 622, and the "dirty" bit is set at step 624. At this point, the memory device 10 will wait for a new valid address at step 604 or for the chip enable line 38 to transition to an inactive state. If the chip enable line 38 becomes inactive, the contents of the cache 14 are written back to the EEPROM/Flash non-volatile memory array at step 628, the "dirty" bit is cleared at step 630 and the process 600 returns to wait for an active CE line 38.

In a write "miss" mode of operation, the memory device 10 again waits for an active chip enable line 38 at decision step 602 and a valid address at step 604. As before, the write cycle is determined by the state of the write enable line 40. The address is latched at step 606 and compared at step 608. If the address is not in the cache 14, it must be determined if a write cycle is in progress at decision step 632. If the write cycle is in progress, it must complete at step 634 before loading the cache 14 at step 642, the Ready line 32 is asserted at step 616 and the process 600 proceeds as described above. If a write cycle is not in progress, the "dirty" bit is checked at step 636. If the cache 14 is "clean", the new row is loaded into the cache 14 at step 642, the Ready line 32 is asserted at step 616 and the process 600 proceeds as previously described. If the "dirty" bit is set at decision step 636, the contents of the cache 14 are written back to the EEPROM/Flash non-volatile memory array at step 638, the write cycle is completed at step 634, the Ready line 32 is asserted at step 616 and the process 600 proceeds as described above.

While there have been described above the principles of the present invention in conjunction with specific non-volatile memory array technologies and an SRAM-based cache it is to be clearly understood that the foregoing description is made only by way of example and not as a limitation to the scope of the invention. For example, other non-volatile memory technologies may be used to construct the memory array and, in fact, any relatively faster access time memory technology may then be utilized in fabricating the cache. A specific example would be an EEPROM or Flash-based memory array wherein the cache is constructed of FRAM-based memory (requiring a non-volatile "dirty" bit) since it exhibits a faster (and symmetric) read and write time than that of the memory array itself. In this example, a non-volatile memory array is cached by use of a non-volatile memory-based cache. Moreover, although an asynchronous parallel memory device has been illustrated and described herein, the principles of the present invention are likewise applicable to serial and synchronous memory device architectures as well.

Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A non-volatile monolithically integrated memory device comprising:
   a non-volatile memory array having associated row and column decoders;
   an address bus for receiving row and column address signals for application to said row and column decoders respectively;
   a cache interposed between said column decoder and said non-volatile memory array, said cache having a relatively faster access time than said non-volatile memory array;
   a data bus coupled to said cache for receiving data to be written to a location in said non-volatile memory array specified by said row and column decoders and for prosecuting data read from said memory array at a location specified by said row and column decoders, and
   wherein the cache and the non-volatile memory array are fabricated as portions of the same monolithic integrated circuit.

2. The non-volatile memory device of claim 1 wherein said non-volatile memory array comprises a ferroelectric memory array.

3. The non-volatile memory device of claim 1 wherein said cache comprises static random access memory.

4. The non-volatile memory device of claim 1 wherein said non-volatile memory array comprises erasable programmable read only memory.

5. The non-volatile memory device of claim 4 wherein said erasable programmable read only memory is electrically erasable.

6. The non-volatile memory device of claim 4 wherein said cache comprises static random access memory.

7. The non-volatile memory device of claim 4 wherein said cache comprises ferroelectric memory.

8. The non-volatile memory device of claim 1 wherein said non-volatile memory array comprises Flash memory.

9. The non-volatile memory device of claim 8 wherein said cache comprises static random access memory.

10. The non-volatile memory device of claim 8 wherein said cache comprises ferroelectric memory.

11. The non-volatile memory device of claim 1 further comprising:
    a row address latch coupled between said address bus and said row decoder; and
    a column address latch coupled between said address bus and said column decoder.

12. The non-volatile memory device of claim 11 further comprising:
    a row address compare block coupled to said row address latch for providing an indication of whether a row of data specified by said row address signal presently maintained in said row address latch is currently in said cache.

13. The non-volatile memory device of claim 12 wherein said memory device provides an external signal when said row of data specified by said row address signal presently maintained in said row address latch is currently in said cache.

14. The non-volatile memory device of claim 12 wherein said data bus comprises a data input line and a data output line.

15. The non-volatile memory device of claim 12 further comprising an I/O controller coupled to said data bus and said row address compare block for receiving an external chip enable signal.

16. The non-volatile memory device of claim 12 wherein said I/O controller further receives an external write enable signal.

17. The non-volatile memory device of claim 12 wherein said I/O controller further receives an external output enable signal.

18. The non-volatile memory device of claim 11 wherein said cache is a write back cache.

19. The non-volatile memory device of claim 11 wherein said cache is a write through cache.

20. The non-volatile memory device of claim 1 further comprising an internally generated Ready signal supplied on an external output thereof.

* * * * *